(12) United States Patent
Chang et al.

(10) Patent No.: US 11,568,920 B2
(45) Date of Patent: Jan. 31, 2023

(54) DUAL ROW-COLUMN MAJOR DRAM

(71) Applicant: Samsung Electronics Co., Ltd., Suwon-si (KR)

(72) Inventors: Mu-Tien Chang, Santa Clara, CA (US); Dimin Niu, Sunnyvale, CA (US); Hongzhong Zheng, Los Gatos, CA (US)

(73) Assignee: SAMSUNG ELECTRONICS CO., LTD.

( * ) Notice: Subject to any disclaimer, the term of this patent is extended or adjusted under 35 U.S.C. 154(b) by 901 days.

(21) Appl. No.: 15/713,587

(22) Filed: Sep. 22, 2017

(65) Prior Publication Data
US 2019/0043553 A1 Feb. 7, 2019

Related U.S. Application Data

(60) Provisional application No. 62/540,556, filed on Aug. 2, 2017.

(51) Int. Cl.
*G06F 3/00* (2006.01)
*G11C 11/408* (2006.01)
(Continued)

(52) U.S. Cl.
CPC ........ *G11C 11/4085* (2013.01); *G06F 3/0604* (2013.01); *G06F 3/0656* (2013.01); *G06F 3/0659* (2013.01); *G06F 3/0673* (2013.01); *G11C 5/025* (2013.01); *G11C 7/109* (2013.01); *G11C 11/403* (2013.01); *G11C 11/4076* (2013.01); *G11C 11/4094* (2013.01); *G11C 11/4097* (2013.01); *G11C 5/04* (2013.01)

(58) Field of Classification Search
CPC .................................................. G11C 11/4085
See application file for complete search history.

(56) References Cited

U.S. PATENT DOCUMENTS 4,896,294 A   1/1990   Shimizu et al.
6,141,250 A  10/2000   Kashimura
(Continued)

FOREIGN PATENT DOCUMENTS

EP    0319691 A2    6/1989
JP    S5525860 A    2/1980
(Continued)

*Primary Examiner* — Jae U Yu
(74) *Attorney, Agent, or Firm* — Renaissance IP Law Group LLP

(57) ABSTRACT

A memory device includes an array of 2T1C DRAM cells and a memory controller. The DRAM cells are arranged as a plurality of rows and columns of DRAM cells. The memory controller is internal to the memory device and is coupled to the array of DRAM cells. The memory controller is capable of receiving commands input to the memory device and is responsive to the received commands to control row-major access and column-major access to the array of DRAM cells. In one embodiment, each transistor of a memory cell includes a terminal directly coupled to a storage node of the capacitor. In another embodiment, a first transistor of a memory cell includes a terminal directly coupled to a storage node of the capacitor, and a second transistor of the 2T1C memory cell includes a gate terminal directly coupled to the storage node of the capacitor.

20 Claims, 8 Drawing Sheets

(51) Int. Cl.
*G06F 3/06* (2006.01)
*G11C 11/4094* (2006.01)
*G11C 5/02* (2006.01)
*G11C 11/403* (2006.01)
*G11C 11/4097* (2006.01)
*G11C 11/4076* (2006.01)
*G11C 7/10* (2006.01)
*G11C 5/04* (2006.01)

(56) References Cited

U.S. PATENT DOCUMENTS

| | | |
|---|---|---|
| 6,195,305 B1 | 2/2001 | Fujisawa et al. |
| 6,233,669 B1 | 5/2001 | Scott et al. |
| 6,256,221 B1 | 7/2001 | Holland et al. |
| 6,301,649 B1 | 10/2001 | Takasugi |
| 7,221,580 B1 | 5/2007 | Penchuk |
| 7,408,218 B2 | 8/2008 | Akiyama et al. |
| 7,881,147 B2 | 2/2011 | Chen et al. |
| 8,583,692 B2 * | 11/2013 | Ganesh ............... G06F 16/284 707/796 |
| 8,976,571 B2 | 3/2015 | Kamata |
| 9,343,138 B2 | 5/2016 | Antonyan |
| 9,672,895 B2 | 6/2017 | Antonyan |
| 10,166,685 B2 | 1/2019 | Haruna |
| 2001/0042163 A1 * | 11/2001 | Ryan ............... G06F 13/1694 711/105 |
| 2005/0073871 A1 * | 4/2005 | Luk ............... G11C 11/405 365/149 |
| 2009/0327660 A1 | 12/2009 | Bains et al. |
| 2010/0054035 A1 | 3/2010 | Dono et al. |
| 2010/0080064 A1 | 4/2010 | Di Iorio et al. |
| 2012/0287729 A1 | 11/2012 | Hirobe |
| 2016/0293232 A1 | 10/2016 | Ishizu et al. |

FOREIGN PATENT DOCUMENTS

| | | |
|---|---|---|
| JP | H01151095 A | 6/1989 |
| JP | 2001351378 A | 12/2001 |
| JP | 2009016646 A | 1/2009 |
| JP | 2013008431 A | 1/2013 |
| JP | 6353796 B2 | 7/2018 |
| KR | 20150071732 A | 6/2015 |
| KR | 101736884 B1 | 5/2017 |
| TW | 200931436 A | 7/2009 |
| TW | 201310452 A | 3/2013 |

* cited by examiner

DUAL ROW-COLUMN MAJOR DRAM

CROSS-REFERENCE TO RELATED APPLICATION

This patent application claims the priority benefit under 35 U.S.C. § 119(e) of U.S. Provisional Patent Application No. 62/540,556, filed on Aug. 2, 2017, the disclosure of which is incorporated herein by reference in its entirety.

TECHNICAL FIELD

The subject matter disclosed herein generally relates to memory systems, and more particularly, to a dynamic random access memory (DRAM) system that provides both row-major and column-major accesses a DRAM array.

BACKGROUND

Matrix operations (such as, but not limited to: transpose, inversion, multiplication and addition) are frequently used in emerging compute intensive applications, such as deep learning, computer vision, and image processing. Some of these operations, however, use substantial column accesses. For example, a transpose operation requires reading a row and storing the row in a column. A multiplication operation involves reading one row from matrix A, and one column from matrix B and the product of the two is computed and stored.

Conventional DRAM is structured to support "row-major" row accesses, in which accessing a row involves activation of a single row, which is relatively fast and efficient. Accessing a column is more difficult because it involves activating each row that intersects with the desired column, which is relatively slow and inefficient.

SUMMARY

An example embodiment provides a memory device that may include an array of a plurality of DRAM cells and a memory controller. The array may be arranged as a plurality of rows of DRAM cells and a plurality of columns of DRAM cells. Each DRAM cell may include a two-transistor, one capacitor (2T1C) memory cell. The memory controller may be internal to the memory device and may be coupled to the array of DRAM cells. The memory controller may be capable of receiving commands input to the memory device and may be responsive to the received commands to control row-major access and column-major access to the array of DRAM cells. In one embodiment, the array of the plurality of DRAM cells may further include a plurality of row bit lines and a plurality of column bit lines in which each respective row bit line may be coupled to DRAM cells in a corresponding row, and each respective column bit line may be coupled to DRAM cells in a corresponding column. The memory device may further include a row buffer coupled to the plurality of row bit lines, and a column buffer coupled to the plurality of column bit lines, in which the memory controller internal to the memory device may be further coupled to the row buffer and the column buffer and may be configured to control operation of the row buffer and the column buffer in response to the received commands.

Another example embodiment provides a memory device that may include an array of a plurality of DRAM cells arranged to form a plurality of rows of DRAM cells and a plurality of columns of DRAM cells, a plurality of row wordline drivers, a plurality of column wordline drivers, and a memory controller that may be internal to the memory device. The array of the plurality of DRAM cells may further include a plurality of row wordline driver lines and a plurality of column wordline driver lines in which each row wordline driver line may be coupled to a corresponding DRAM cell in a row of DRAM cells, and each column wordline driver line may be coupled to a corresponding DRAM cell in a column of DRAM cells. Each row wordline driver may be coupled to a corresponding DRAM cell in a row of DRAM cells. Each column wordline driver may be coupled to a corresponding DRAM cell in a column of DRAM cells. The memory controller may be coupled to the plurality of row wordline drivers and the plurality of column wordline drivers in which the memory controller may be capable of receiving commands input to the memory device and may be responsive to the received commands to control the plurality of row wordline drivers and the plurality of column wordline drivers to provide access to the array of DRAM cells. In one embodiment, each DRAM cell may include a two-transistor, one capacitor (2T1C) memory cell. In another embodiment, each transistor of the 2T1C memory cell may include a terminal directly coupled to a first terminal of the capacitor. In still another embodiment, a first transistor of the 2T1C memory cell may include a terminal directly coupled to a first terminal of the capacitor, and a second transistor of the 2T1C memory cell may include a gate terminal directly coupled to the first terminal of the capacitor.

Still another embodiment provides a memory module that may include an array of a plurality of DRAM cells, and a memory controller that is internal to the memory module. The array may be arranged as a plurality of rows of DRAM cells and a plurality of columns of DRAM cells. The memory controller may be coupled to the array of DRAM cells, and the memory controller may be capable of receiving commands input to the memory module and may be responsive to the received commands to control row-major access and column-major access to the array of DRAM cells. In one embodiment, the memory module may include a dual in-line memory module (DIMM) form factor. In one embodiment, the array of the plurality of DRAM cells may further include a plurality of row bit lines and a plurality of column bit lines in which each respective row bit line may be coupled to DRAM cells in a corresponding row, and each respective column bit line may be coupled to DRAM cells in a corresponding column. The memory device may further include a row buffer coupled to the plurality of row bit lines, and a column buffer coupled to the plurality of column bit lines, in which the memory controller internal to the memory device may be further coupled to the row buffer and the column buffer and may be configured to control operation of the row buffer and the column buffer in response to the received commands.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1:
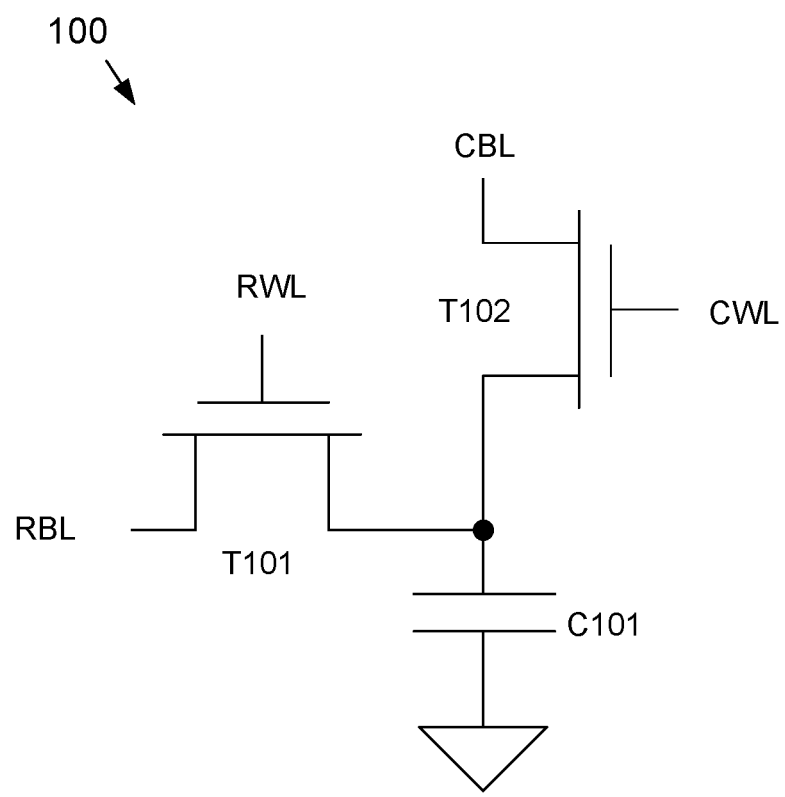
FIG. 1 depicts a schematic diagram of an example embodiment of a first configuration of a 2T1C DRAM cell according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs.

As used herein, the term "module" refers to any combination of software, firmware and/or hardware configured to provide the functionality described herein in connection with a module. The term "software," as applied to any implementation described herein, may be embodied as a software package, code and/or instruction set or instructions. The term "hardware," as applied to any implementation described herein, may include, for example, singly or in any combination, hardwired circuitry, programmable circuitry, state-machine circuitry, and/or firmware that stores instructions executed by programmable circuitry. The modules may, collectively or individually, be embodied as software, firmware and/or hardware that forms part of a larger system, such as, but not limited to, an integrated circuit (IC), system on-chip (SoC) and so forth.

The subject matter disclosed herein provides DRAM architectures that support both row "major" and column "major" accesses, such that both rows and columns can be accessed with substantially equal speed and efficiency. The DRAM architectures include two configurations of two transistor, one capacitor (2T1C) DRAM cells, DRAM commands to control the DRAM architectures, and an internal controller to control the two configurations of 2T1C DRAM architectures and to resolve any consistency issues.

FIG. 1 depicts a schematic diagram of an example embodiment of a first configuration of a 2T1C DRAM cell 100 according to the subject matter disclosed herein. The DRAM cell 100 may include a first transistor T101, a second transistor T102 and a capacitor C101. The first and second transistors T101 and T102 operate as switches to access or to store a voltage stored on the capacitor C101. It should be noted that for the configuration of a DRAM cell 100 read operations are destructive.

A first terminal of the first transistor T101 may be coupled to a row bit line (RBL), and a second terminal of the first transistor T101 may be coupled to a first terminal of the capacitor C101. A gate terminal of the first transistor T101 may be coupled to a row word line (RWL). A first terminal of the second transistor T102 may be coupled to a column bit line (CBL), and a second terminal of the second transistor T102 may be coupled to the first terminal of the capacitor C101. A gate terminal of the second transistor T102 may be coupled to a column word line (CWL). The first terminal of the capacitor C101 may be considered to be a storage node. A second terminal of the capacitor C101 may be coupled to ground.

Figure 2:
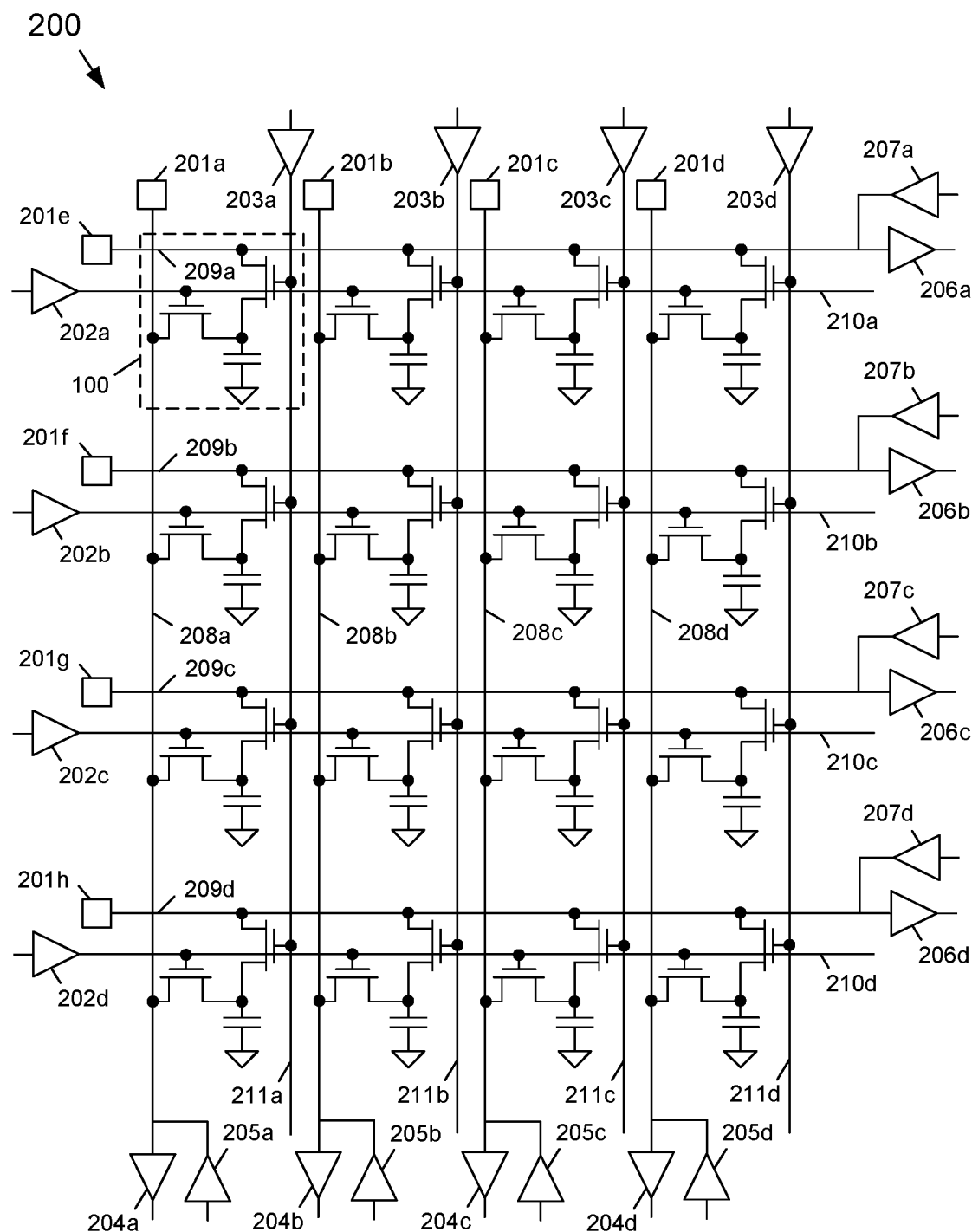
FIG. 2 depicts a schematic diagram of an example embodiment of an array that may include a plurality of DRAM cells according to the subject matter disclosed herein.

FIG. 2 depicts a schematic diagram of an example embodiment of an array 200 that may include a plurality of DRAM cells 100 according to the subject matter disclosed herein. The example embodiment depicted in FIG. 2 includes 16 DRAM cells 100 arranged in four rows and four columns, of which only one DRAM cell 100 has been indicated. It should be understood that the array 200 may include more or fewer than the number of DRAM cells 100 depicted in FIG. 2. Additionally, the array 200 may include more or fewer rows and/or columns depicted in FIG. 2.

The array 200 also may include precharge circuits 201a-201h, row wordline drivers 202a-202d, column wordline drivers 203a-203d, row sense amplifiers (SA) 204a-204d, row write drivers 205a-205d, column SAs 206a-206d, and column write drivers 207a-207d. In one embodiment, the row SAs and the column SAs may be differential SAs.

The precharge circuits 201a-201d may be respectively coupled to row bit lines 208a-208d. The precharge circuits 201e-201h may be respectively coupled to column bit lines 209a-209d. The outputs of the row wordline drivers 202a-202d may be respectively coupled to row wordlines 210a-210d. The outputs of the column wordline drivers 203a-203d may be respectively coupled to column wordlines 211a-211d. The inputs of the row SAs 204a-204d may be respectively coupled to the row bit lines 208a-208d. The outputs of the row write drivers 205a-205d may be respectively coupled to the row bit lines 208a-208d. The inputs of the column SAs 206a-206d may be respectively coupled to the column bit lines 209a-209d. The outputs of the column write drivers 207a-207d may be respectively coupled to the column bit lines 209a-209d.

Figure 3:
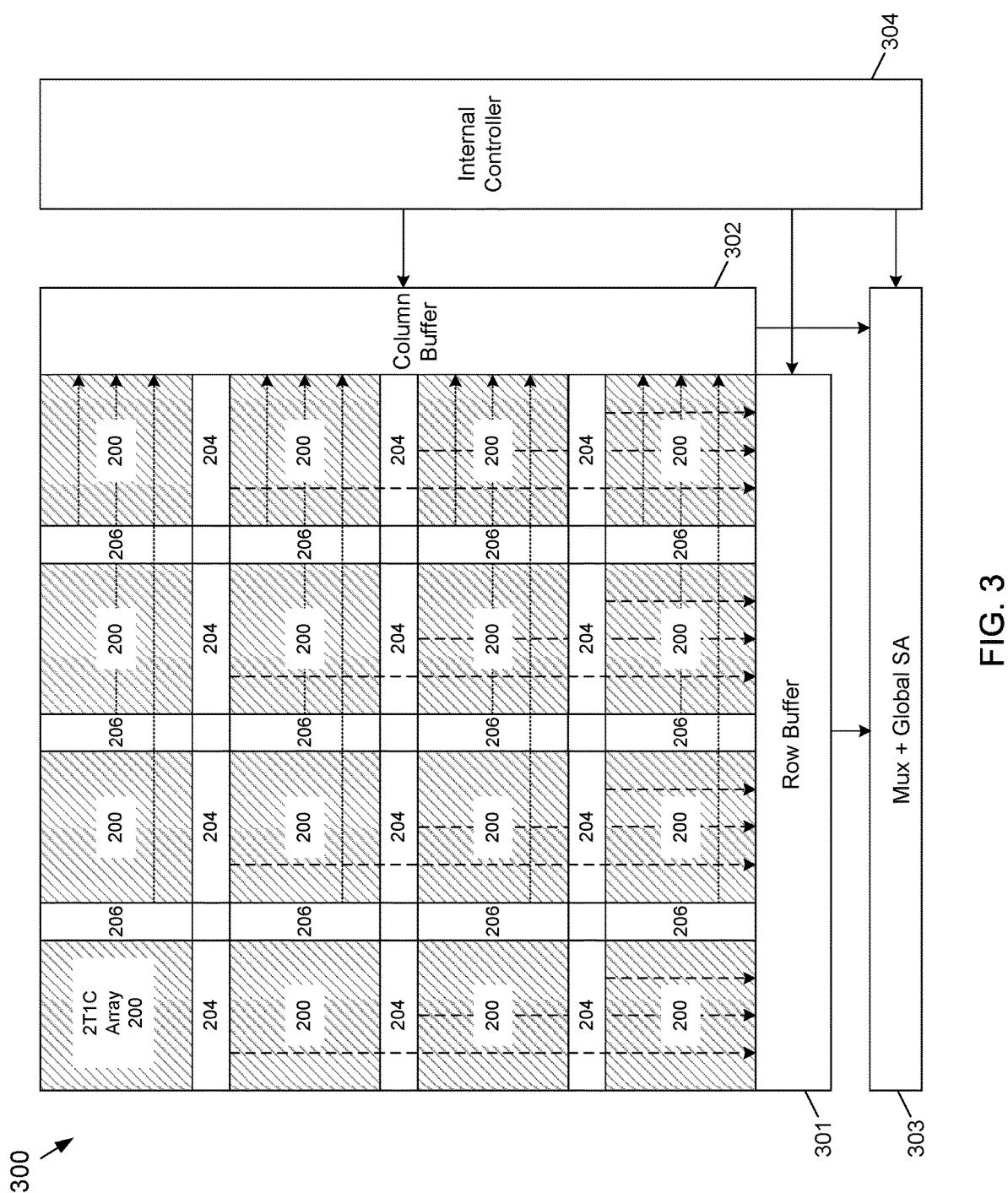
FIG. 3 depicts a schematic diagram of an example embodiment of a dual row-column-major access DRAM memory according to the subject matter disclosed herein.

FIG. 3 depicts a schematic diagram of an example embodiment of a dual row-column-major access DRAM memory 300 according to the subject matter disclosed herein. The DRAM memory 300 may include 16 arrays 200 (FIG. 2) arranged in four rows and four columns. It should be understood that the DRAM memory 300 may have more than or less than the number of DRAM cell arrays 200 depicted in FIG. 3. It should also be understood that the DRAM memory 300 may include more or fewer rows and/or columns depicted in FIG. 3. The row SAs 204 may be configured to be shared by arrays 200 arranged in a column (i.e., arrays to the top and bottom in FIG. 3). Similarly, the column SAs 206 may be configured to be shared by arrays 200 arranged in a row (i.e., arrays to the left and right in FIG. 3).

The DRAM memory 300 may also include a row buffer 301, a column buffer 302, a multiplexer and global SA 303, and an internal controller 304. The row buffer 301 may be coupled to the respective outputs of the row SAs 204, and the column buffer 302 may be coupled to the respective outputs of the column SAs 206. The row buffer 301 and the column buffer 302 may be coupled to the multiplexer and global SA 303. The multiplexer and global SA 303 may be configured to receive data that is to be stored in the memory 300 and/or output data from the memory 300. The internal controller 304 may be coupled to the row buffer 301, the column buffer 302 and the multiplexer and global SA 303 to control their respective operations. The various components forming the DRAM memory 300 may be integrated into one integrated circuit, or alternatively may be formed from one or more modules.

Figure 4:
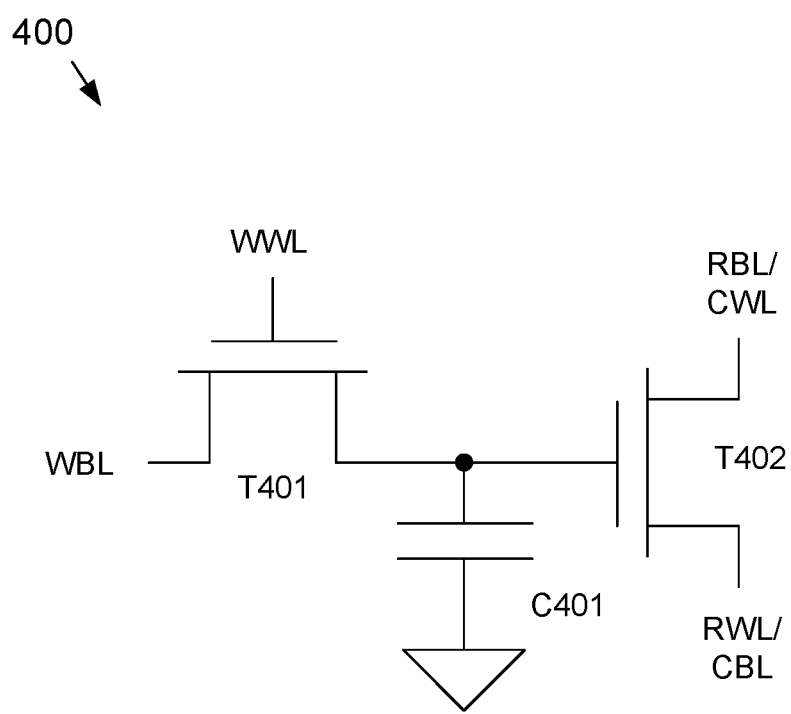
FIG. 4 depicts a schematic diagram of an example embodiment of a second configuration of a 2T1C DRAM cell according to the subject matter disclosed herein.

FIG. 4 depicts a schematic diagram of an example embodiment of a second configuration of a 2T1C DRAM cell 400 according to the subject matter disclosed herein. The DRAM cell 400 may include a first transistor T401, a second transistor T402 and a capacitor C401. The first and second transistors T401 and T402 operate as switches to access a voltage stored on the capacitor C401. It should be noted that for the configuration of a DRAM cell 400 read operations are not destructive, but concurrent read operations are not allowed with DRAM cells 400 because the row and column share common bit and word lines.

A first terminal of the first transistor T401 may be coupled to a write bit line (WBL), and a second terminal of the first transistor T401 may be coupled to a first terminal of the capacitor C401. A gate terminal of the first transistor T401 may be coupled to a write word line (WWL). A first terminal of the second transistor T402 may be coupled to a row bit line/column wordline (RBL/CWL), and a gate terminal of the second transistor T402 may be coupled to the first terminal of the capacitor C401. A second terminal of the second transistor T402 may be coupled to a row wordline/column bit line (RWL/CBL). The first terminal of the capacitor C401 may be considered to be a storage node. A second terminal of the capacitor C401 may be coupled to ground.

The configuration of the DRAM cell 400 provides row read and write accesses, column reads, but not column-based writes. Writes are always row-based writes, that is, both row writes and column writes are always a row-major access. Additionally, the DRAM cell 400 provides an advantage of non-destructive reads, which also provides for shorter row cycle times. The row bit line (RBL) and the column wordline (CWL) coupled to a DRAM cell 400 are interchangeable and may be selectably coupled to the same port of an array containing the DRAM cell 400. Similarly, the row wordline (RWL) and the column bit line (CBL) are interchangeable and may be selectably coupled to the same port of an array containing the DRAM cell 400. If a DRAM cell 400 is to be read in a row-major access, the first terminal of the transistor T402 is selectably coupled to the RBL and the second terminal of the transistor T402 is selectably coupled to the RWL. If a DRAM cell 400 is to be read in a column-major access, the first terminal of the transistor T402 is selectably coupled to the CWL and the second terminal of the transistor T402 is selectably coupled to the CBL.

If a DRAM cell 400 is in not active and is in a standby mode, both the WBL and WWL nodes that are coupled to the transistor T401 and both the RBL/CWL and RWL/CBL nodes that are coupled to the transistor T402 will be precharged to VDD. During row reads, the RWL will transition from VDD to ground. If the storage node of the capacitor C401 is high, the voltage on RBL will be pulled down to VDD−ΔV, that is, pulled down to a voltage that is less than VDD. If the storage node of the capacitor C401 is low, RBL will remain at VDD. The row SA will detect the resulting voltage on RBL and will output the value of the stored bit. Column reads will operate in a similar way.

Figure 5:
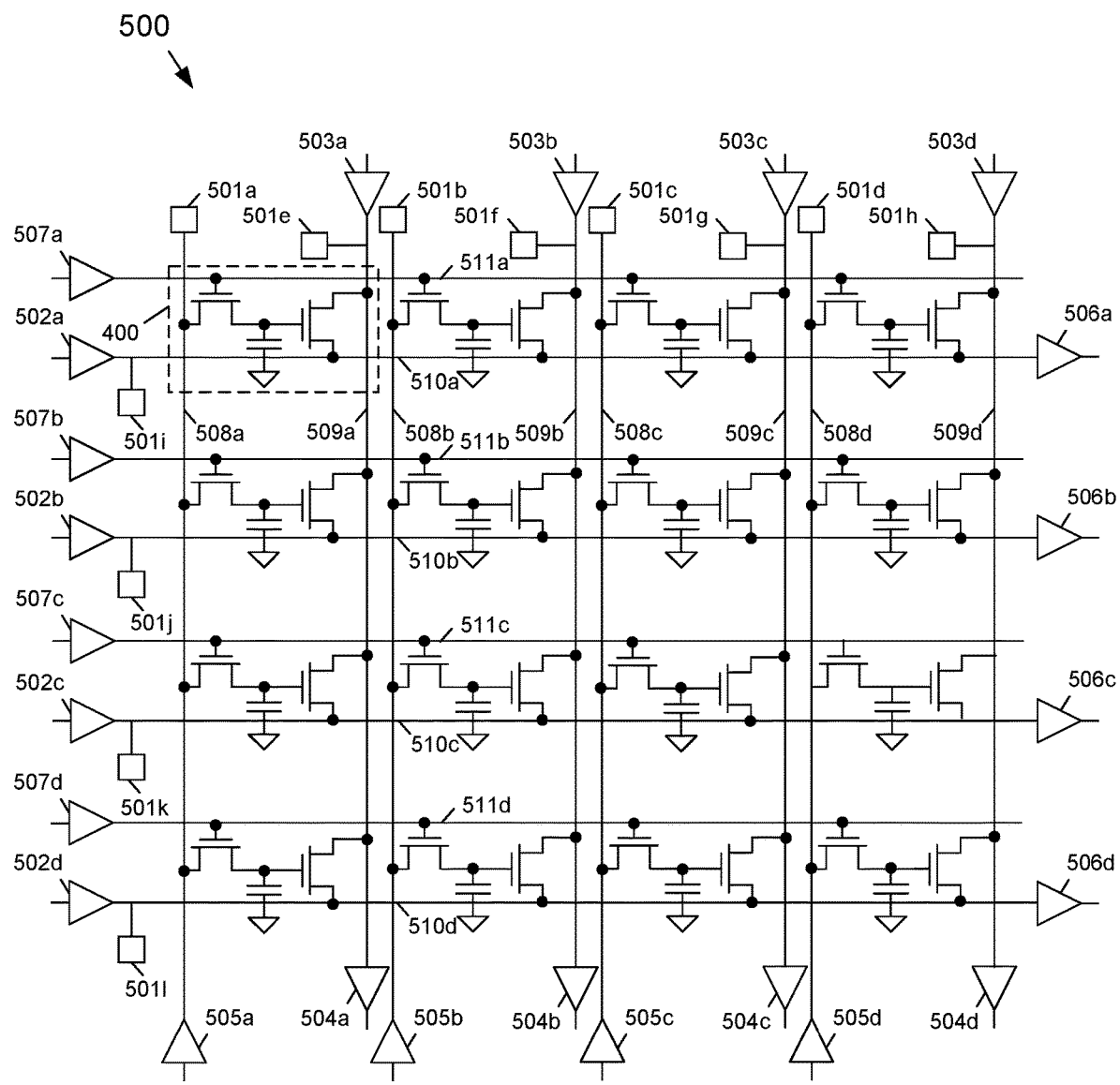
FIG. 5 depicts a schematic diagram of an example embodiment of a dual row-column-major access DRAM memory that may include a plurality of DRAM cells according to the subject matter disclosed herein.

FIG. 5 depicts a schematic diagram of an example embodiment of a dual row-column-major access DRAM memory 500 that may include a plurality of DRAM cells 400 according to the subject matter disclosed herein. The example embodiment of the DRAM memory 500 depicted in FIG. 5 includes 16 DRAM cells 400 arranged in four rows and four columns, of which only one DRAM cell 400 has been indicated. It should be understood that the DRAM memory 500 may include more or fewer than the number of DRAM cells 400 depicted in FIG. 5. Additionally, the array 500 may include more or fewer rows and/or columns depicted in FIG. 5.

The DRAM memory 500 also may include precharge circuits 501a-501l, row wordline drivers 502a-502d, column wordline drivers 503a-503d, row SAs 504a-504d, row write drivers 505a-505d, column SAs 506a-506d, and write wordline drivers 507a-507d. In one embodiment, the row SAs and the column SAs may be differential SAs.

The precharge circuits 501a-501d may be respectively coupled to write bit lines 508a-508d. The precharge circuits 501e-501h may be respectively coupled to row bit lines/column wordlines 509a-509d. The precharge circuits 501i-501l may be respectively coupled to row wordlines/column bit lines 510a-510d. The outputs of the row wordline drivers 502a-502d may also be respectively coupled to row wordlines/column bit lines 510a-510d. The outputs of the column wordline drivers 503a-503d may be respectively coupled to row bit lines/column wordlines 509a-509d. The inputs of the row SAs 504a-504d may also be respectively coupled to the row bit lines/column wordlines 509a-509d. The outputs of the row write drivers 505a-505d may be respectively coupled to the write bit lines 508a-508d. The inputs to the column SAs 506a-506d may be respectively coupled to the row write lines/column bit lines 510a-510d. The outputs of the write wordline drivers 507a-507d may be respectively coupled to the write wordlines 511a-511d.

Figure 6:
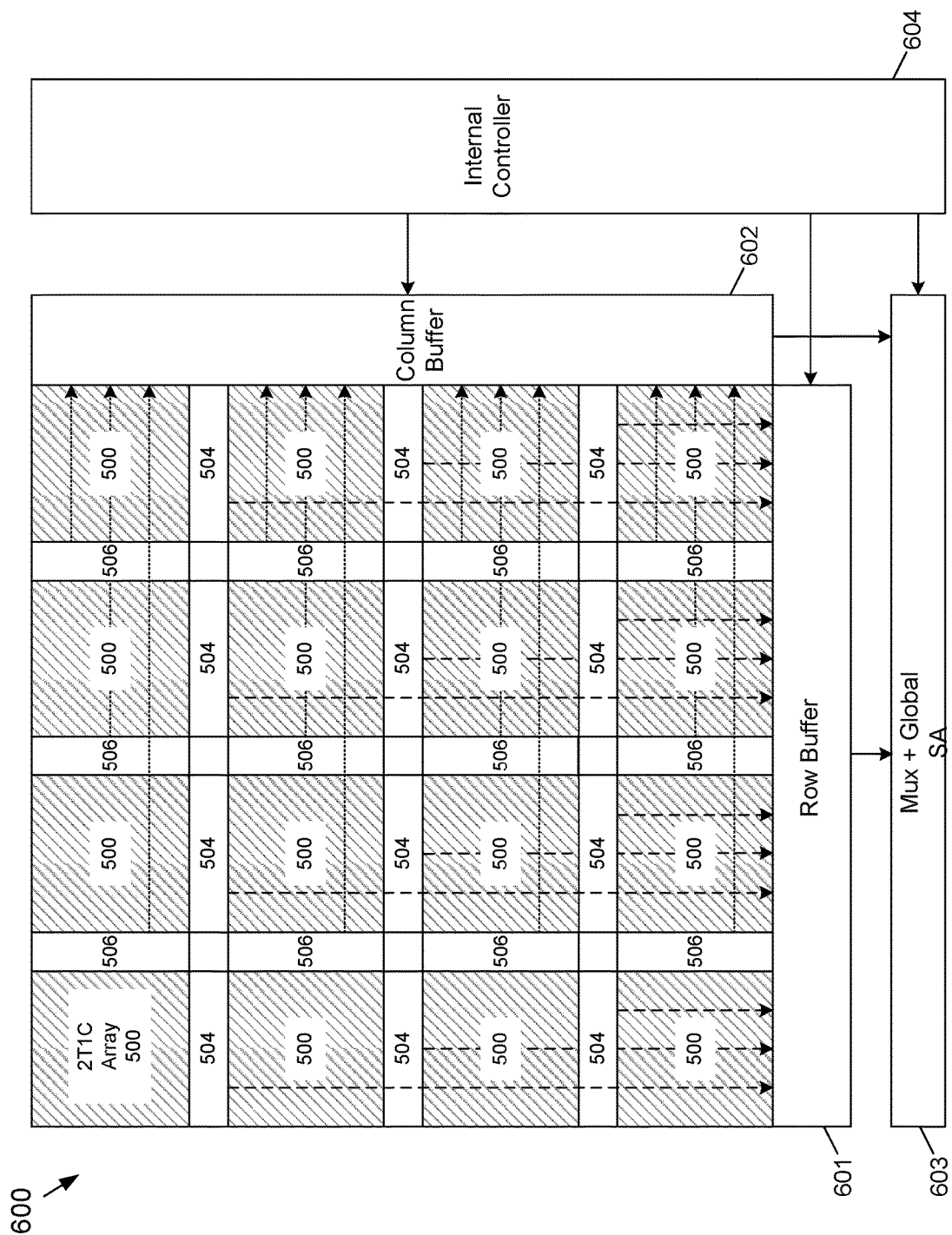
FIG. 6 depicts a schematic diagram of an example embodiment of a dual row-column-major access DRAM memory according to the subject matter disclosed herein.

FIG. 6 depicts a schematic diagram of an example embodiment of a dual row-column-major access DRAM memory 600 according to the subject matter disclosed herein. The DRAM memory 600 may include 16 arrays 500 (FIG. 5) arranged in four rows and four columns. It should be understood that the DRAM memory 600 may have more than or less than the number of DRAM cell arrays 500 depicted in FIG. 6. It should also be understood that the DRAM memory 600 may include more or fewer rows and/or columns depicted in FIG. 6. The row SAs 504 may be configured to be shared by arrays 500 arranged in a column (i.e., arrays to the top and bottom in FIG. 6). Similarly, the column SAs 506 may be configured to be shared by arrays 500 arranged in a row (i.e., arrays to the left and right in FIG. 6). It should be noted that the read path for the DRAM memory 600 (using DRAM cell 400) is the same as the DRAM memory 300 (using DRAM cell 100), and the write path is the same as conventional DRAM, that is, the write path is based on a row-major access.

The DRAM memory 600 may also include a row buffer 601, a column buffer 602, a multiplier and global SA 603, and an internal controller 604. The row buffer 601 may be coupled to the respective outputs of the row SAs 504, and the column buffer 602 may be coupled to the respective outputs of the column SAs 506. The row buffer 601 and the column buffer 602 may be coupled to the multiplexer and global SA 603. The internal controller 604 may be coupled to the row buffer 601, the column buffer 602 and the multiplexer and global SA 603 to control their respective operations. The various components forming the DRAM memory 600 may be integrated into one integrated circuit, or alternatively may be formed from one or more modules.

The internal controller 304 (FIG. 3) and the internal controller 604 (FIG. 6) may be configured to be responsive to commands to utilize the row buffer 301, 601 and the column buffer 302, 602 to provide both a row-major access and a column-major access DRAM memory. Additionally, the internal controllers 304 and 604 utilize the row and column buffers to reduce accesses to the memories 300 and 600 in situations of a buffer hit.

For a row-major access functionality, the internal controllers 304 and 604 may be responsive to new commands, such as, an activate row (ACT_R) command to activate a selected row, a read row (RD_R) command to read a selected row, a write row (WR_R) command to write to a selected row, and a precharge row (PRE_R) command to precharge a selected row. For a column-major access functionality, the internal controllers 304 and 604 may be responsive to new commands, such as, an activate column (ACT_C) command to activate a selected column, a read column (RD_C) command to read a selected column, a write column (WR_C) command to write a selected column, and a precharge column (PRE_C) command to precharge a selected column. Other commands that both the internal controllers 304 and 604 may be responsive to include, but are not limited to, refresh (REF) to refresh, for example, a selected bank, power down (PD) to power down, for example, a selected bank and self-refresh (SR) to self-refresh a selected bank.

A memory controller that may be part of a central processing unit (CPU) or a graphics processing unit (GPU), but is not part of the internal DRAM controller 304 or 604 disclosed herein, may be configured to provide data consistency. For example, for a DRAM cell 100 in a situation in which a column (or a row) is read after reading a row (or a column), the DRAM cell 100 read operations are destructive and the first read will destroy some of the contents of the second read. Read operations for the DRAM cell 400 are not destructive, so the situation in which a column (or a row) is read after reading a row (or a column) does not present a data consistency issue. Thus, the DRAM architecture disclosed herein may allow concurrent activate row (ACT_R) and activate column (ACT_C) commands, but when the memory controller tries to issue the read row (RD_R) and the read column (RD_C) commands, the memory controller 304 may first determine if there is a conflict with the cells read for both reads, and the memory controller 304 may send a precharge command before the second read command to restore the contents of the DRAM cells in conflict.

Figure 7:
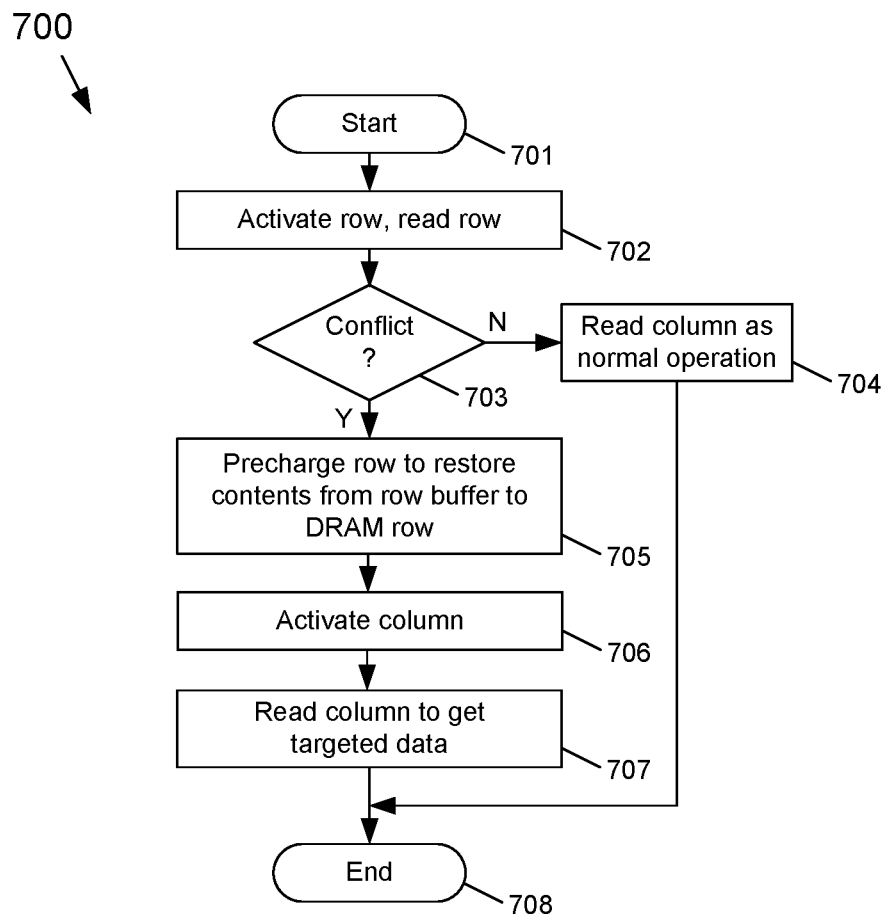
FIG. 7 depicts a flow chart of an example embodiment of a process to provide data consistency for a memory containing DRAM cells in a situation in which a column (or a row) is read after reading a row (or a column) according to the subject matter disclosed herein.

FIG. 7 depicts a flow chart of an example embodiment of a process 700 to provide data consistency for a memory 300 containing DRAM cells 100 in a situation in which a column (or a row) is read after reading a row (or a column) according to the subject matter disclosed herein. The process 700 starts at 701. At 702, the memory controller is requested to read a subset of data from a row, and a subset of data from a column. This involves an ACT_R command followed by an RD_R command, and an ACT_C command followed by a RD_C command. At 702, the memory controller may first issue an ACT_R command to activate the entire selected row using row-major access. The memory controller may then issue an RD_R command to read the target data in that activated row. At 703, before issuing ACT_C and RD_C commands, the memory controller may first determine whether any of the targeted DRAM cells 100 for the column read overlap, or conflict, with any of the targeted DRAM cells 100 of the row read. If, for example, there is no conflict at 703, flow continues to 704 where the memory controller may issue an ACT_C command using column-major access, and an RD_C command to read the target data in the activated column. Flow ends at 708 when data from both row and column return to the memory controller.

If, at 703, there is a conflict, flow continues to 705 where the memory controller may issue a PRE_R command to close the activated row to restore the DRAM cells to their original content. The flow continues to 706 where the memory controller may then issue an ACT_C command and at 707 issues an RD_C command to read the targeted data in the selected column. It should be understood that the order of activating and read row and columns may be reversed, in which case if there is a conflict, the memory controller may at 705 issue a PRE_C command to close the activated column. At 706, the memory controller may then issue an ACT_R command and at 707 issue an RD_C command to read the targeted data in the selected row.

Another data consistency issue that may arise occurs for both DRAM cells 100 and 400 in which a write row (or column) operation is followed by a read column (or row) operation. In this situation, the read operation subsequent to a write operation may read old data because the write operation may be at the buffer stage. To avoid this data consistency issue, the external memory controller may close the buffer before the read operation.

Yet another data consistency issue that may arise occurs for both DRAM cells 100 and 400 in which a write row (or column) operation is followed by a write column (or row) operation. In this situation, if the column buffer is closed before the row buffer, then older data that has been written to the row buffer will be used to update the array. To avoid this data consistency issue, the memory controller may schedule precharge commands in the same order as the write operations so that the last buffer that was written to will restore the DRAM memory last.

Still another data consistency issue that may arise occurs for both DRAM cells 100 and 400 in which a read row (or column) operation is followed by a write column (or row) operation. If the column buffer is closed before the row buffer, older data (the read data in the row buffer) will be used to restore the DRAM memory. To avoid this data consistency issue, the external memory controller may schedule precharge commands in the order of read/write operations.

Figure 8:
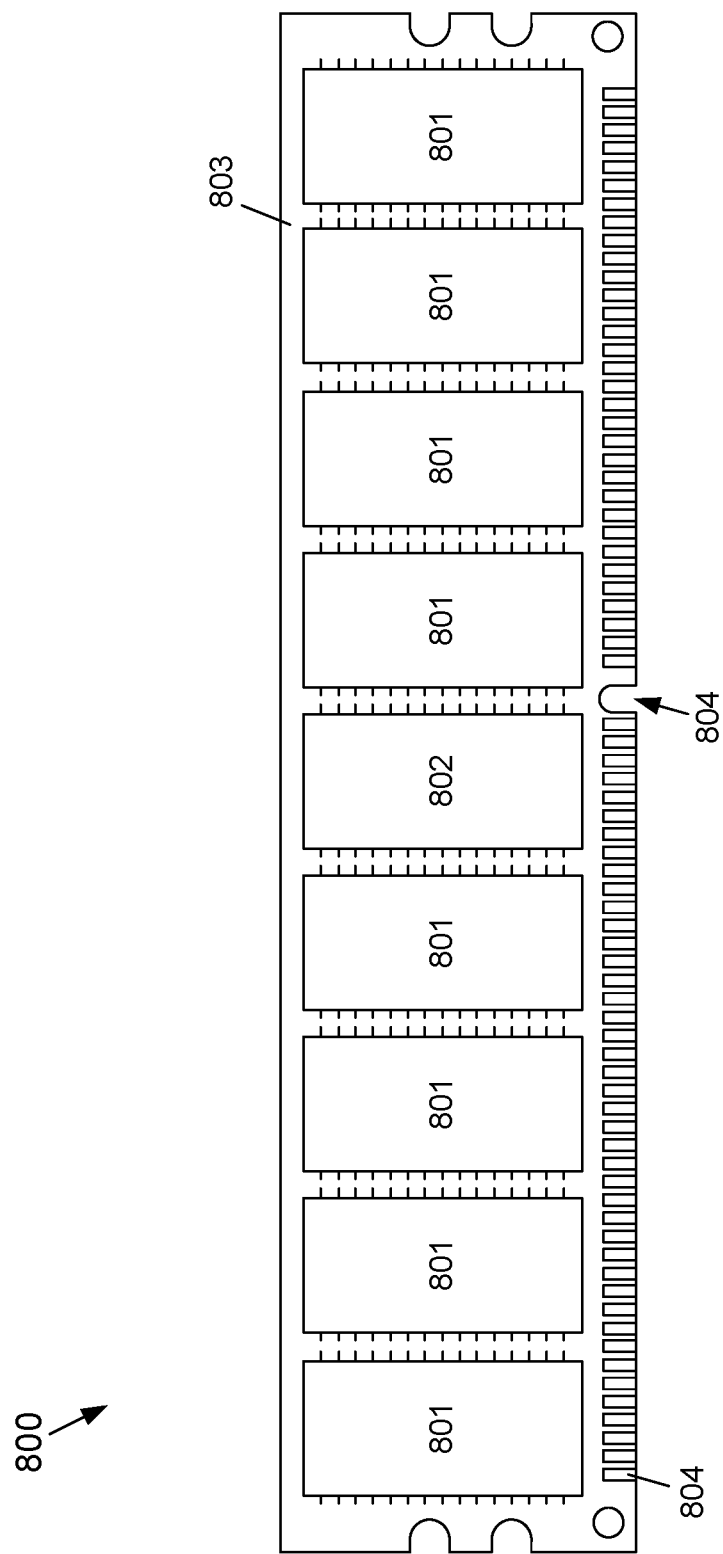
FIG. 8 depicts an example embodiment of a dual in-line memory module that may include DRAM arrays that provide row-major and column-major access according to the subject matter disclosed herein.

FIG. 8 depicts an example embodiment of a dual in-line memory module (DIMM) 800 that may include DRAM arrays that provide row-major and column-major access according to the subject matter disclosed herein. The DIMM 800 may include a plurality of memory chips 801 and a module controller 802 that are mounted on a printed circuit board (PCB) 803. The PCB 803 may include a plurality of pins 804, of which only one pin has been indicated. In one embodiment, the DIMM 800 may include one or more polarization notches 805. At least one memory chip 801 may include one or more DRAM arrays that provide row-major and column-major access, similar to the DRAM arrays 200 and/or 500 disclosed herein. The module controller 802 may provide control functionality for the DIMM 800. The DIMM 800 may also include a form factor that is associated with single dual in-line memory modules (SIMMs) and/or DIMMs. It should be understood that the DIMM 800 may include more than or fewer than the number of memory chips 801 and the number of module controllers 802 depicted in FIG. 8.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A memory device, comprising:
an array of a plurality of dynamic random access memory (DRAM) cells, the array arranged as a plurality of rows of DRAM cells and a plurality of columns of DRAM cells; and
a memory controller internal to the memory device and coupled to the array of DRAM cells, the memory controller capable of receiving commands input to the memory device and being responsive to the received commands to control row-major access and column-major access to the array of DRAM cells.

2. The memory device of claim 1, wherein the array of the plurality of DRAM cells further comprises a plurality of row bit lines and a plurality of column bit lines, each respective row bit line being coupled to DRAM cells in a corresponding row, and each respective column bit line being coupled to DRAM cells in a corresponding column,
the memory device further comprising:
a row buffer coupled to the plurality of row bit lines; and
a column buffer coupled to the plurality of column bit lines,
wherein the memory controller internal to the memory device is further coupled to the row buffer and the column buffer and is configured to control operation of the row buffer and the column buffer in response to the received commands.

3. The memory device of claim 2, further comprising a precharge circuit coupled to each row line and each column bit line.

4. The memory device of claim 2, wherein the memory device is part of a dual in-line memory module (DIMM).

5. The memory device of claim 1, wherein each DRAM cell comprises a two-transistor, one capacitor (2T1C) memory cell.

6. The memory device of claim 5, wherein each transistor of the 2T1C memory cell comprises a terminal directly coupled to a storage node of the capacitor.

7. The memory device of claim 5, wherein a first transistor of the 2T1C memory cell comprises a terminal directly coupled to a storage node of the capacitor, and a second transistor of the 2T1C memory cell comprises a gate terminal directly coupled to the storage node of the capacitor.

8. A memory device, comprising:
an array of a plurality of dynamic random access memory (DRAM) cells, the array arranged to comprise a plurality of rows of DRAM cells and a plurality of columns of DRAM cells, the array of the plurality of DRAM cells further comprising a plurality of row wordline driver lines and a plurality of column wordline driver lines, each row wordline driver line being coupled to a corresponding DRAM cell in a row of DRAM cells, and each column wordline driver line being coupled to a corresponding DRAM cell in a column of DRAM cells;
a plurality of row wordline drivers, each row wordline driver being coupled to a corresponding DRAM cell in a row of DRAM cells;
a plurality of column wordline drivers, each column wordline driver being coupled to a corresponding DRAM cell in a column of DRAM cells; and
a memory controller internal to the memory device and coupled to the plurality of row wordline drivers and the plurality of column wordline drivers, the memory controller capable of receiving commands input to the memory device and being responsive to the received commands to control the plurality of row wordline drivers and the plurality of column wordline drivers to provide access to the array of DRAM cells.

9. The memory device of claim 8, wherein the array of the plurality of DRAM cells further comprises a plurality of row bit lines and a plurality of column bit lines, each respective row bit line being coupled to DRAM cells in a corresponding row, and each respective column bit line being coupled to DRAM cells in a corresponding column,
the memory device further comprising:
a row buffer coupled to the plurality of row bit lines; and a column buffer coupled to the plurality of column bit lines, wherein the memory controller internal to the memory device is further coupled to the row buffer and the column buffer and is configured to control operation of the row buffer and the column buffer in response to the received commands.

10. The memory device of claim 9, further comprising a precharge circuit coupled to each row line and each column bit line.

11. The memory device of claim 9, wherein the memory device is part of a dual in-line memory module (DIMM).

12. The memory device of claim 8, wherein each DRAM cell comprises a two-transistor, one capacitor (2T1C) memory cell.

13. The memory device of claim 12, wherein each transistor of the 2T1C memory cell comprises a terminal directly coupled to a first terminal of the capacitor.

14. The memory device of claim 12, wherein a first transistor of the 2T1C memory cell comprises a terminal directly coupled to a first terminal of the capacitor, and a second transistor of the 2T1C memory cell comprises a gate terminal directly coupled to the first terminal of the capacitor.

15. A memory module, comprising:
an array of a plurality of dynamic random access memory (DRAM) cells, the array arranged as a plurality of rows of DRAM cells and a plurality of columns of DRAM cells; and
a memory controller internal to the memory module and coupled to the array of DRAM cells, the memory controller capable of receiving commands input to the memory module and being responsive to the received commands to control row-major access and column-major access to the array of DRAM cells, the memory module comprising a dual in-line memory module (DIMM) form factor.

16. The memory module of claim 15, wherein the array of the plurality of DRAM cells further comprises a plurality of row bit lines and a plurality of column bit lines, each respective row bit line being coupled to DRAM cells in a corresponding row, and each respective column bit line being coupled to DRAM cells in a corresponding column,
the memory module further comprising:
a row buffer coupled to the plurality of row bit lines; and
a column buffer coupled to the plurality of column bit lines,
wherein the memory controller internal to the memory module is further coupled to the row buffer and the column buffer and is configured to control operation of the row buffer and the column buffer in response to the received commands.

17. The memory module of claim 16, further comprising a precharge circuit coupled to each row line and each column bit line.

18. The memory module of claim 15, wherein each DRAM cell comprises a two-transistor, one capacitor (2T1C) memory cell.

19. The memory module of claim 18, wherein each transistor of the 2T1C memory cell comprises a terminal directly coupled to a storage node of the capacitor.

20. The memory module of claim 18, wherein a first transistor of the 2T1C memory cell comprises a terminal directly coupled to a storage node of the capacitor, and a second transistor of the 2T1C memory cell comprises a gate terminal directly coupled to the storage node of the capacitor.

* * * * *